United States Patent
Lefevre et al.

(10) Patent No.: US 11,626,271 B2
(45) Date of Patent: Apr. 11, 2023

(54) SURFACE FLUORINATION REMEDIATION FOR ALUMINIUM OXIDE ELECTROSTATIC CHUCKS

(71) Applicant: Tokyo Electron Limited, Tokyo (JP)

(72) Inventors: Scott Lefevre, Albany, NY (US); Akiteru Ko, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 17/325,913

(22) Filed: May 20, 2021

(65) Prior Publication Data

US 2021/0398784 A1    Dec. 23, 2021

Related U.S. Application Data

(60) Provisional application No. 63/040,963, filed on Jun. 18, 2020.

(51) Int. Cl.
  *H01J 37/32* (2006.01)
  *H01L 21/683* (2006.01)
  *B08B 7/00* (2006.01)

(52) U.S. Cl.
  CPC ...... *H01J 37/32862* (2013.01); *B08B 7/0035* (2013.01); *H01J 37/32715* (2013.01);
  (Continued)

(58) Field of Classification Search
  CPC ........... H01J 37/32862; H01J 37/32715; H01J 2237/2007; H01J 2237/335; B08B 7/0035;
  (Continued)

(56) References Cited

U.S. PATENT DOCUMENTS 5,507,874 A    4/1996  Su et al.
6,569,257 B1 *  5/2003  Nguyen ............ H01J 37/32862
                                                134/1.1
(Continued)

FOREIGN PATENT DOCUMENTS

JP    4813321    9/2011
JP    2018041886    3/2018
(Continued)

OTHER PUBLICATIONS

International Search Report, PCT/US2021/034870, 190743WO01, dated Sep. 17, 2021, 3 pgs.

*Primary Examiner* — Erin F Bergner
(74) *Attorney, Agent, or Firm* — Egan, Enders & Huston LLP.

(57) ABSTRACT

Embodiments are disclosed for reducing substrate breaks which result from inadequate de-chucking. Contaminants are removed from the surface of a chuck by exposing the chuck to a plasma process that comprises a hydrogen (H)-containing plasma. The chuck is subjected to the hydrogen-based plasma when no substrate is on the chuck. In one embodiment, the plasma is a hydrocarbon-based plasma. Hydrogen in the hydrocarbon plasma may react with and remove the contaminants. The process may further include an additional plasma step for removal of any newly formed materials that may result from the hydrocarbon plasma. The removal step may be, for example, a subsequent plasma ash step. In one embodiment, the chuck is an electrostatic chuck and the contaminants comprise fluorine. By removing contaminants from the chuck surface, improved substrate de-chucking occurs. This improvement correspondingly leads to less substrate breakage when removing substrates from the chuck.

20 Claims, 6 Drawing Sheets

(52) U.S. Cl.
CPC .. *H01L 21/6831* (2013.01); *H01J 2237/2007* (2013.01); *H01J 2237/335* (2013.01)

(58) Field of Classification Search
CPC ........... H01L 21/6831; H01L 21/67028; H01L 21/6833
See application file for complete search history.

(56) References Cited

U.S. PATENT DOCUMENTS

| | | | |
|---|---|---|---|
| 7,052,553 | B1 | 5/2006 | Shih et al. |
| 7,648,582 | B2 | 1/2010 | Steger |
| 2004/0013818 | A1 | 1/2004 | Moon et al. |
| 2014/0158154 | A1 | 6/2014 | Kondo et al. |
| 2014/0373867 | A1 | 12/2014 | Harada |
| 2017/0323768 | A1* | 11/2017 | Zhang ............... H01J 37/32862 |

FOREIGN PATENT DOCUMENTS

| | | |
|---|---|---|
| WO | 2004065658 | 8/2004 |
| WO | 2020060929 | 3/2020 |

* cited by examiner

SURFACE FLUORINATION REMEDIATION FOR ALUMINIUM OXIDE ELECTROSTATIC CHUCKS

This application claims priority to U.S. Provisional Patent Application No. 63/040,963 entitled, "SURFACE FLUORINATION REMEDIATION FOR ALUMINIUM OXIDE ELECTROSTATIC CHUCKS" filed Jun. 18, 2020; the disclosure of which is expressly incorporated herein, in its entirety, by reference.

BACKGROUND

The present disclosure relates to the substrate processing systems used to process substrates. In particular, the disclosure provides methods for treating chucks used to hold substrates in substrate processing systems.

There exists a wide range of substrate processing systems or tools that are used for a variety of purposes in substrate processing. Such purposes include for example, but are not limited to, etch, sputtering, deposition, thermal treatments, coating, developing, oxidation, planarization, etc. Often, the systems and tools that are used for such purposes include a chuck for holding the substrate. One type of chuck utilized is an electrostatic chuck (ESC). An ESC typically has an electrode embedded in the chuck to provide a holding or attracting force between the chuck and the substrate. The ESC chuck may electrostatically clamp the substrate to the chuck to provide a stable holding of the substrate and good contact between the chuck and the substrate. Exemplary forces that may be utilized include for example, but are not limited to, Coulomb-Fore forces and Johnsen-Rahbek forces.

Bias voltages may be applied to the electrode(s) of the chuck to establish the electrostatic holding force to "chuck" the substrate. The bias voltages may be changed to release or "de-chuck" the substrate. When it is desired to remove a substrate from a chuck, the substrate may be released or de-chucked so that the substrate may be moved, for example with lifter pins within the chuck, robotic arms, etc. However, if a substrate is not sufficiently released or de-chucked, the substrate may break when lifter pins, robotic arms, etc. actuate.

It has been found that contaminants on the surface of the ESC may lead to insufficient de-chucking. For example, it has been found that contaminants on the surface of the chuck trap charges which cause the substrate to remain at least partially chucked even when the substrate is meant to be released from the electrostatic forces. Then, when the substrate is attempted to be removed from the chuck, substrate breaks may occur. In one example, it is known that fluorination of the surface of a chuck effects the basic electrostatic force mechanisms by trapping charges. These charges can counteract the desire to electrostatically release the substrate when the substrate is to be removed from the chuck. Thus, the trapped charges which result from surface fluorination may ultimately cause substrates to remain at least partially chucked post-process, leading to substrate breaks.

The sources of contaminants which form on the ESC surface are varied. In the example of fluorine contaminants, the fluorine may come from a variety of sources. For example, when running a plasma process on a substrate with fluorine contained in the plasma discharge, inevitably there will be trace to significant amounts of fluorine containing residues remaining in the chamber. Even when running a dry clean sequence in the tool there may exist a portion of time where the surface of the ESC is exposed and can passively collect some of this residue. Conversely even if the contamination remains on other surfaces such as the chamber walls or focus ring of the plasma tool, if any discharge or very high voltage discharges occur when a substrate is not present, there is the potential to activate this fluorine containing residues and allow the fluorine to react with the ESC surface. Regardless of the exact mechanism and source of the contamination, contamination of the surface will occur. For example, fluorination does happen to the surface of the ESC over time. This fluorination can dramatically shorten operational lifetimes of the chuck, while also causing a risk of breaking production substrates.

Various techniques are utilized to address the problems of fluorination of the chuck surface. For example, the chuck can be removed from the process tool for physically cleaning and resurfacing. However, this approach increases tool downtime and is costly. Alternatively, the trapped charges in the fluorinated chuck surface may be removed by exposing the chuck surface to a nitrogen-based plasma. Such a plasma may decrease the charge trapping (and undesirable electrostatic effects). However, it has been found that fluorine still remains, and sufficient charge trapping may still occur such that substrate breaks still happen. In yet another approach, a high voltage discharge with inverse bias voltage may be used to decrease the trapped charges. The inverse bias voltage techniques still do not satisfactorily address the charge trapping and do not address the surface fluorination.

It would be desirable to provide a more reliable method for removing contaminants from an ESC surface to provide improved de-chucking of a substrate from an ESC.

SUMMARY

Various embodiments of substrate processing methods are disclosed herein for reducing substrate breaks which result from inadequate de-chucking. In one embodiment, contaminants are removed from the surface of a chuck by exposing the chuck to a plasma process that comprises a hydrogen (H)-containing plasma. The chuck is subjected to the hydrogen-based plasma when no substrate is on the chuck. In one embodiment, the plasma is a hydrocarbon-based plasma. Hydrogen in the hydrocarbon plasma may react with and remove the contaminants. The process may further include an additional plasma step for removal of any newly formed materials that may result from the hydrocarbon plasma. The removal step may be, for example, a subsequent plasma ash step. In one embodiment, the chuck is an electrostatic chuck, and the contaminants may comprise fluorine. By removing contaminants from the chuck surface, improved substrate de-chucking occurs. This improvement correspondingly leads to less substrate breakage when removing substrates from the chuck.

In a first embodiment, a method to reduce substrate breaks when removing a substrate from a chuck is provided. The method may comprise providing the chuck with a contaminant on a surface of the chuck. The method further comprises exposing the surface of the chuck to a hydrogen-containing plasma while the chuck is substrate-less. The method also comprises removing at least some of the contaminant from the surface of the chuck by use of the hydrogen-containing plasma so contaminant related substrate breaks may be decreased.

In alternative embodiments of the first embodiment, the chuck is an electrostatic chuck. In some embodiments, the contaminant comprises fluorine. In one embodiment, the hydrogen-containing plasma is a hydrocarbon-containing plasma. In some embodiments, the hydrocarbon-containing plasma contains methane.

In alternative embodiments of the first embodiment, a second plasma process is performed that removes at least some deposits formed on the chuck during the hydrogen-containing plasma process. In some embodiments, the hydrogen-containing plasma is a hydrocarbon-containing plasma and the second plasma process is a plasma ash process. In one embodiment, the chuck has an aluminum oxide surface. In one embodiment the chuck is an electrostatic chuck. In some embodiments the contaminant comprises fluorine. In one embodiment the hydrocarbon-containing plasma contains methane.

In a second embodiment, a method of removing fluorine from a surface of an electrostatic chuck to reduce substrate breaks is provided. The method comprises exposing the surface of the electrostatic chuck to a hydrogen-containing plasma while the electrostatic chuck is substrate-less. The method further comprises reacting the fluorine contaminant with the hydrogen-containing plasma to remove at least some of the fluorine from the surface of the electrostatic chuck. The method also comprises removing at least some of the fluorine contaminant from the surface of the electrostatic chuck so that substrate de-chucking characteristics of the electrostatic chuck may be improved, and related substrate breaks may be decreased.

In alternative embodiments of the second embodiment, the hydrocarbon-containing plasma contains methane. In another embodiment the electrostatic chuck has an aluminum oxide surface. In some embodiments the electrostatic chuck is exposed to a second plasma process after being exposed to the hydrocarbon-containing plasma, wherein the second plasma process removes deposits formed on the electrostatic chuck during its exposure to the hydrocarbon-containing plasma. In further embodiments the second plasma process is an oxygen plasma ash process. In some embodiments this hydrocarbon-containing plasma contains methane.

In alternative embodiments of the second embodiment and its possible modifications, the method of removing fluorine further comprises performing multiple cycles of the hydrocarbon-containing plasma process and the second plasma process. In some embodiments the second plasma process is an oxygen plasma ash process.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Various embodiments of substrate processing methods are disclosed herein for reducing substrate breaks which result from inadequate de-chucking. In one embodiment, contaminants are removed from the surface of a chuck by exposing the chuck to a plasma process that comprises a hydrogen (H)-containing plasma. The chuck is subjected to the hydrogen-based plasma when no substrate is on the chuck. In one embodiment, the plasma is a hydrocarbon-based plasma. Hydrogen in the hydrocarbon plasma may react with and remove the contaminants. The process may further include an additional plasma step for removal of any newly formed materials that may result from the hydrocarbon plasma. The removal step may be, for example, a subsequent plasma ash step. In one embodiment, the chuck is an electrostatic chuck and the contaminants comprise fluorine. By removing contaminants from the chuck surface, improved substrate de-chucking occurs. This improvement correspondingly leads to less substrate breakage when removing substrates from the chuck.

Figure 1:
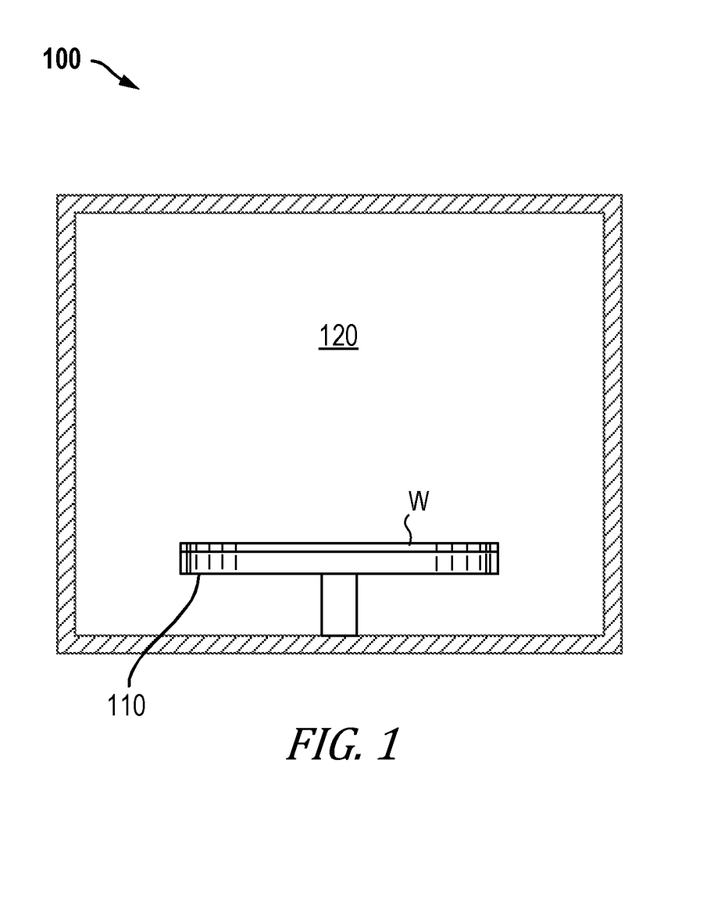
FIG. 1 illustrates an exemplary plasma processing system having a chuck.

FIG. 1 illustrates an exemplary plasma processing system 100 which includes a chuck 110 for holding a substrate W (for example a semiconductor wafer) within a plasma chamber 120. A wide variety of plasma processing systems are well known in the art and the system of FIG. 1 merely illustrates portions of such a system. It will be recognized many other plasma processing system components are not shown (such as but not limited to power sources, electrodes, gas inlets, gas outlets, temperature control structures, focus rings, etc.). The techniques described herein are not limited to a particular plasma system but more generally relate to the use of a chuck within a plasma chamber. Further, though the chuck of FIG. 1 is shown supporting a substrate, as described in more detail below, the techniques provided herein are generally performed as a substrate-less process. More particularly, the techniques are typically performed when a substrate is not placed on the chuck. In this manner the surface of the chuck can be exposed to the plasma generated in the plasma chamber.

An ESC typically has an outer coating. In one embodiment described herein, the outer coating may be an aluminum oxide (AlO), for example alumina ($Al_2O_3$). The techniques disclosed herein may be particularly useful for treating AlO surfaces. However, it will be recognized that the concepts disclosed herein are not limited to ESCs that comprise AlO and chucks having other materials may benefit from the techniques disclosed herein. As disclosed herein, in one exemplary embodiment a method is disclosed for remove fluorine from the AlO surface of an ESC.

In one embodiment, a chuck treatment technique removes contaminants from the surface of an ESC by exposing the ESC to a plasma process that comprises a hydrocarbon plasma when no substrate is on the chuck. Alternative versions of the chuck treatment technique may be utilized to accomplish the contaminant removal. In one version, the plasma process comprises a single plasma step, the single plasma step including hydrogen in the plasma. The hydrogen in the single plasma step reacts with and removes contaminants that are on the surface of the ESC. In another alternative, the plasma process comprises multiple plasma steps: (1) a first plasma step which includes a hydrogen, the first plasma reacting with and removing the contaminants, and (2) a second plasms step (for example an ashing plasma) which removes any material that may be formed on the ESC as a result of the first plasma step. The ashing plasma may utilize a variety of chemistries. For example an oxygen ($O_2$) plasma chemistry may be utilized. Alternatively, the ashing plasma may include nitrogen ($N_2$), hydrogen ($H_2$), and/or other non-fluorine containing plasma chemistries that remove organics. In one embodiment, the processes described herein may be utilized to counteract the fluorination which occurs on an AlO surface of an ESC, though the techniques are not limited to such an embodiment. In one particular embodiment of the techniques described above, a hydrocarbon-based plasma is used to supply the hydrogen. In a more particular embodiment, the hydrocarbon is methane ($CH_4$).

Figure 2A:
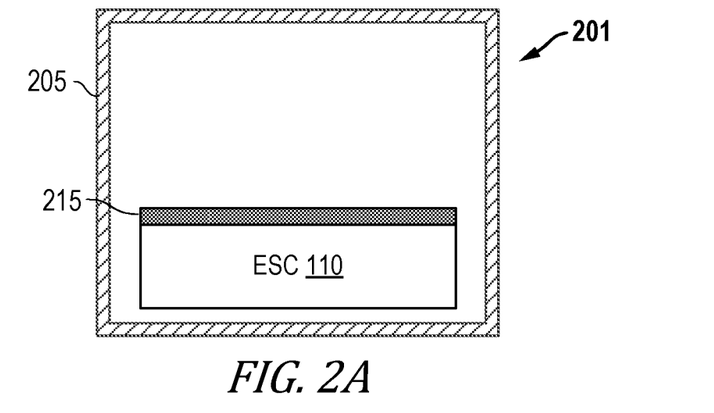
FIGS. 2A-2C illustrate an exemplary process utilizing the techniques described herein.
Figure 2B:
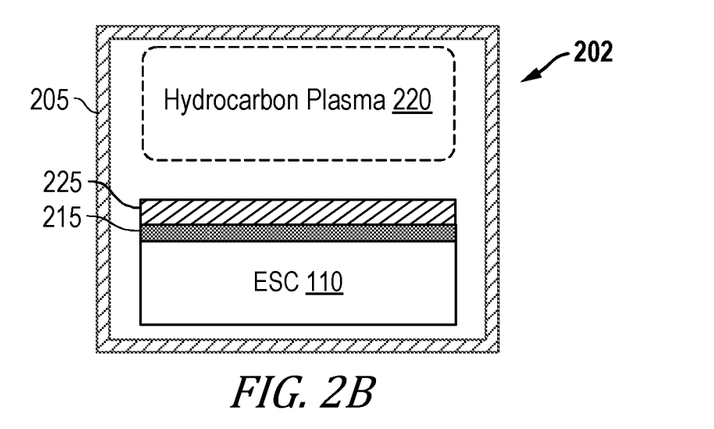
Figure 2C:
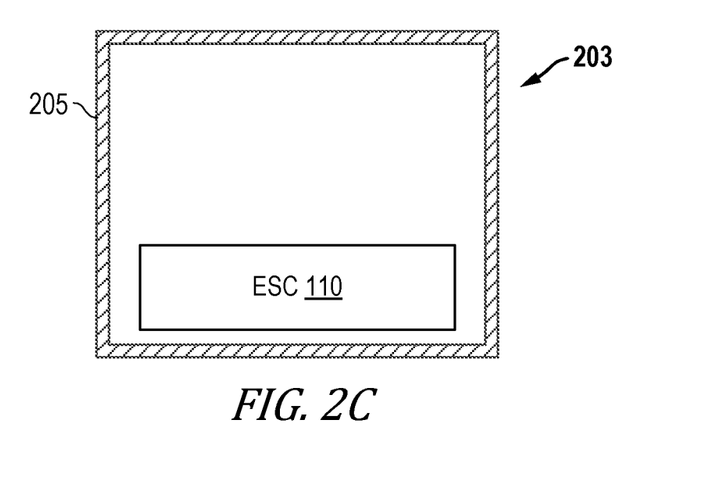

Thus, one embodiment of the disclosed techniques involves running a hydrogen containing plasma over an exposed chuck. In one particular embodiment, the hydrogen containing plasma is a hydrocarbon-containing plasma. In another embodiment, fluorine may be removed from an ESC through the use of this hydrogen-containing plasma. Further, an additional plasma step may be utilized to remove any deposits on the ESC surface which may result from use of the hydrocarbon plasma. In one embodiment, this additional removal step may be an ashing plasma. In one particular example, an oxygen ($O_2$) plasma ash step is utilized. Thus, the fluorine and any deposits from the fluorine removal plasma may be removed from the ESC through this combination of plasma steps. For example, FIGS. 2A-2C show a high-level process flow having steps 200, 202 and 203 of one embodiment. As shown in FIG. 2A, the process flow includes a first step 201 of providing a plasma chamber 205 within which an ESC 110 (without a substrate present) resides. The ESC 110 has a contaminant layer 215 (for example a fluorinated surface layer). Next, as shown in FIG. 2B step 202, a hydrocarbon plasma 220 is formed over the ESC 110 as shown in the figure. The hydrocarbon plasma 220 reacts with the contaminant containing layer 215 (as shown by reaction area 225) to remove at least some contaminants. After the hydrocarbon processing, a contaminant free ESC 110 may result as shown in FIG. 2C step 203. In one embodiment, the contaminant layer 215 comprises a fluorinated material.

Figure 3A:
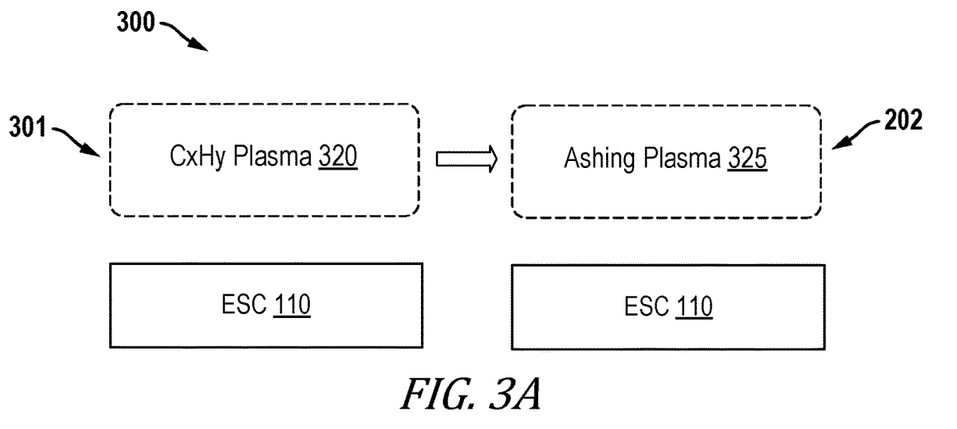
FIG. 3A illustrates one exemplary alternative embodiment of the process flow 100 of FIGS. 2A-2C.
Figure 3B:
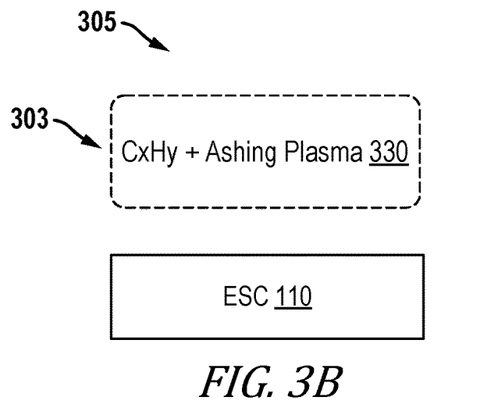
FIG. 3B illustrates an alternative embodiment that combines the hydrocarbon chemistry and ashing removal chemistry into one plasma step process.
Figure 3C:
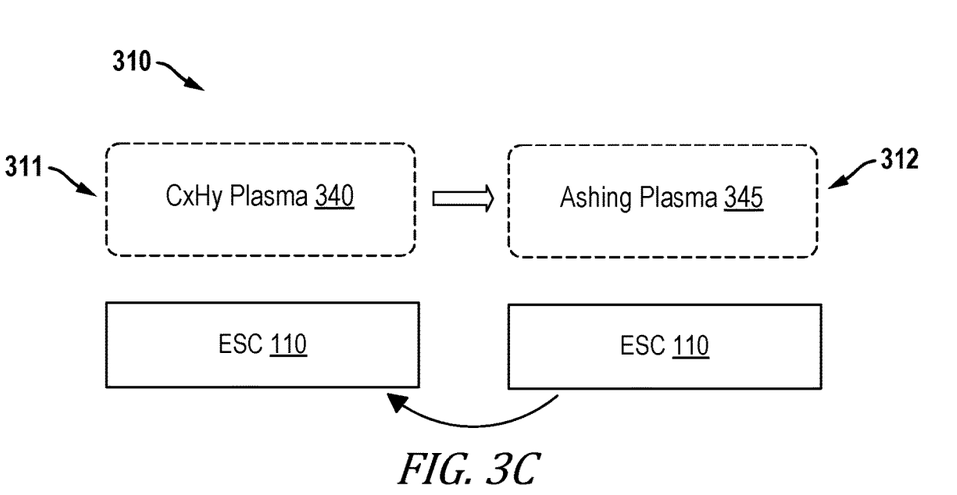
FIG. 3C illustrates an embodiment similar to FIG. 3A, but repeating the hydrocarbon and ashing plasma steps in multiple cycles to improve substrate cleaning.

FIGS. 3A-3C illustrate exemplary alternative embodiments of the process flow of FIGS. 2A-2C. In one embodiment as shown in FIG. 3A, a process flow 300 is provided with a first plasma step 301 and a second plasma step 302. The first plasma step 301 comprises forming a hydrocarbon-based plasma 320 over an ESC 110 (the contaminants not being shown in FIGS. 3A-3C). Then, the process flow 300 proceeds to a second plasma step 302 which comprises forming a removal plasma 325 over the ESC 110 for removing any deposits formed by the first plasma step 301. In one embodiment, the removal plasma 325 is an ashing plasma.

In a second embodiment as shown in FIG. 3B, a process flow 305 is provided. As shown in FIG. 3B, process flow 305 comprises a single process step 303. More particularly, a single plasma process 330 that comprises both a hydrocarbon chemistry and a removal chemistry (for example an ashing chemistry) is utilized. The single plasma process 330 is formed over the ESC 110 to both (1) react with and remove contaminants and (2) remove any deposited materials that may result from the use of hydrocarbons in the single plasma process 330. In one embodiment, the single plasma process step 303 comprises a hydrocarbon and ashing plasma.

In a third embodiment as shown in FIG. 3C, a process flow 310 is provided. The process flow 310 is provided with a first plasma step 311 and a second plasma step 312 which are similar to first plasma step 301 and second plasma step 302 described above. In the process flow 310, however, multiple cycles of the first plasma step 311 and second plasma step 312 are performed. In one embodiment of the cyclical process flow, a first plasma step 311 comprises forming a hydrocarbon-based plasma 340 over an ESC 110 (the contaminants not being shown). Then, the process flow 310 proceeds to a second plasma step 312 which comprises forming a removal plasma 345 over the ESC 110 for removing any deposits formed by the first plasma step 311. In one embodiment, the removal plasma is an ashing plasma. In one embodiment, two cycles of the first plasma step 311 and the second plasma step 312 are performed. Thus, the process may proceed as an initial first plasma step 311 is performed followed by an initial second plasma step 312. Then, the process may perform an additional first plasma step 311 and an additional second plasma step 312. In this manner two cycles of the first and second plasma steps may be performed. In other embodiments, more than two cycles are performed. Thus, processing may repeat as shown by the arrow of FIG. 3C. Cycling of the process as seen in process flow 310 may provide better decontamination of the ESC or may be used to handle circumstances of intense contamination.

The plasma parameters and conditions of the plasma steps described above can be adjusted in terms of time, pressure, power, temperature, or gas flows to adjust contaminant removal rates, limit deposits being formed on the ESC from the hydrogen containing plasma, and the removal of any of such deposits to suit particular applications. In general, however, a hydrogen-containing plasma is performed over an exposed chuck, and in more particular embodiments a hydrocarbon plasma is utilized along with some form of deposit removal or ashing step.

Generally, the techniques described herein may be performed at some set production interval. For example, the process may be performed after each substrate is processed on the ESC. Alternatively, the process may be scheduled to be performed after some set number of substrates are processed. In one embodiment, the process may be performed after each lot of substrates is processed. The frequency of performance of the techniques described herein may be impacted by the types of processes being performed and/or the substrates that are being processed, as contamination buildup levels may vary greatly depending on such variables.

Exemplary plasma processes are described below. These exemplary plasma processes may be particularly suited for removing fluorine based contaminates from an AlO surface of ESC, though such processes are merely exemplary. In one embodiment, a methane ($CH_4$) gas-based plasma is used for the reaction step and oxygen ($O_2$)-based plasma is used for the removal step. In other embodiments, other hydrocarbons are used in the reaction step. In either case, hydrogen may react with fluorine, and in particular aluminum fluoride (AlF), on the ESC surface to form volatile species that can be pumped out of the chamber. The removal step may be based on a variety of chemistries including oxygen, nitrogen, hydrogen, carbon dioxide, inert gases, and/or or any combination of these.

Figure 4:
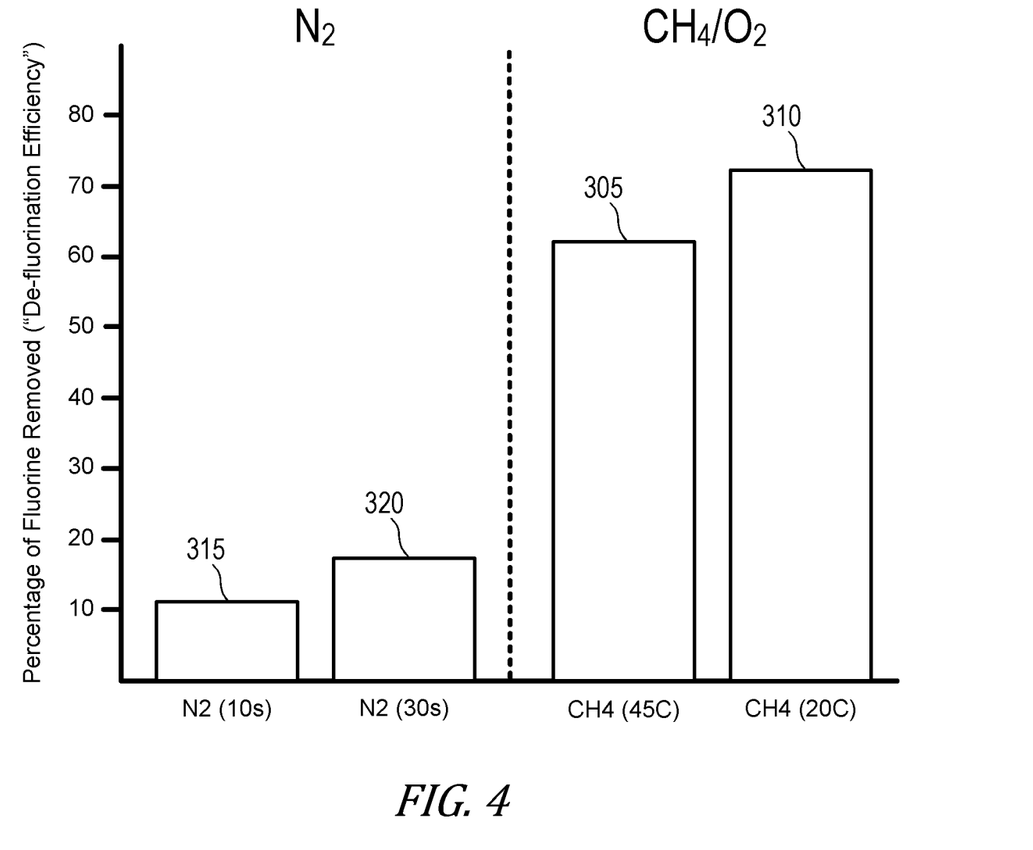
FIG. 4 illustrates expected increases in fluorine removal from using a methane plasma process followed by an oxygen plasma ash process, compared to a traditional nitrogen-based process.

X-ray photoelectron spectroscopy (XPS) results show a significantly removal of fluorine is achieved using the aforementioned process. For example, FIG. 4 illustrates the impact of using a two-step process of a $CH_4$ plasma followed by an $O_2$ plasma. As shown in FIG. 4, the percentage of fluorine removed with the two-step process is compared to using a surface treatment comprised of only a nitrogen-based plasma. FIG. 4 illustrates the percentage of fluorine removal of (1) a hydrocarbon-based two-step process run at 45 degrees C. as shown in graph 305, (2) a hydrocarbon-based two-step process run at 20 degrees C. as shown in graph 310, (3) a nitrogen-based plasma run for 10 seconds as shown in graph 315, and (4) a nitrogen-based plasma run for 30 seconds as shown in graph 320. As shown in FIG. 4, the two step hydrocarbon-based process significantly outperforms the use of a nitrogen plasma. For example, in the results shown in FIG. 4, a nitrogen plasma may remove 12% to 18% of the fluorine over 10 seconds to 30 seconds, while the $CH_4$ plasma followed by an $O_2$ plasma process may remove up to 72% of the fluorine. Further, it is noted that the temperature of the hydrocarbon plasma may impact the amount of fluorine removal. More particularly, if the plasma process is at lower temperatures, more fluorine removal may occur (almost 10% more removal in the example of FIG. 4). It will be recognized, however, that the use of lower temperatures may be counterbalanced against throughput concerns, as the lower temperature processing may decrease throughput.

As mentioned, the plasma parameters and conditions of the plasma steps may be set at a wide variety of settings depending upon the contaminants being removed, the ESC surface, coating, the gases utilized, etc. For example, in one exemplary embodiment, gas flows may range from 20-500 standard cubic centimeters per minute, time may range from 3 to 60 seconds, pressure may range from 1 to 200 Torr and power may range from 100-500 Watts. It will be recognized, however, that such conditions are merely exemplary and other plasma conditions may be utilized.

By removing contaminants from the chuck surface, improved substrate de-chucking occurs. This improvement correspondingly leads to less substrate breakage when removing substrates from the chuck. As mentioned above, the decrease in substrate breakage may be optimized by performing the techniques described herein at a regular basis during production use of the ESC.

Figure 5:
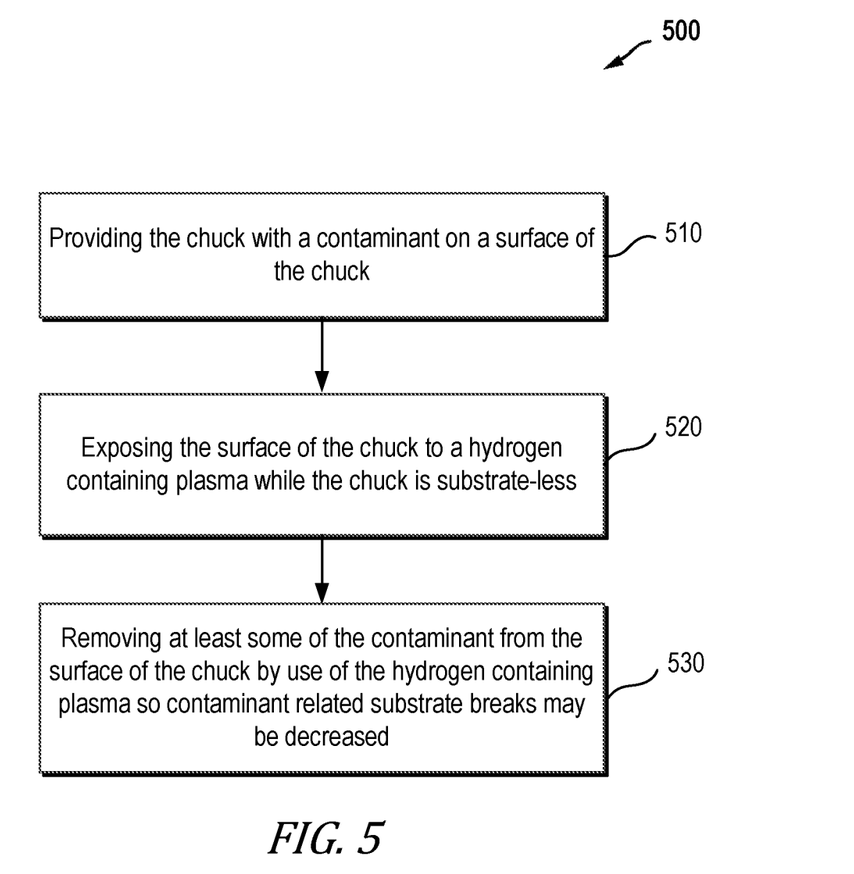
FIG. 5 illustrates one exemplary method utilizing techniques described herein.
Figure 6:
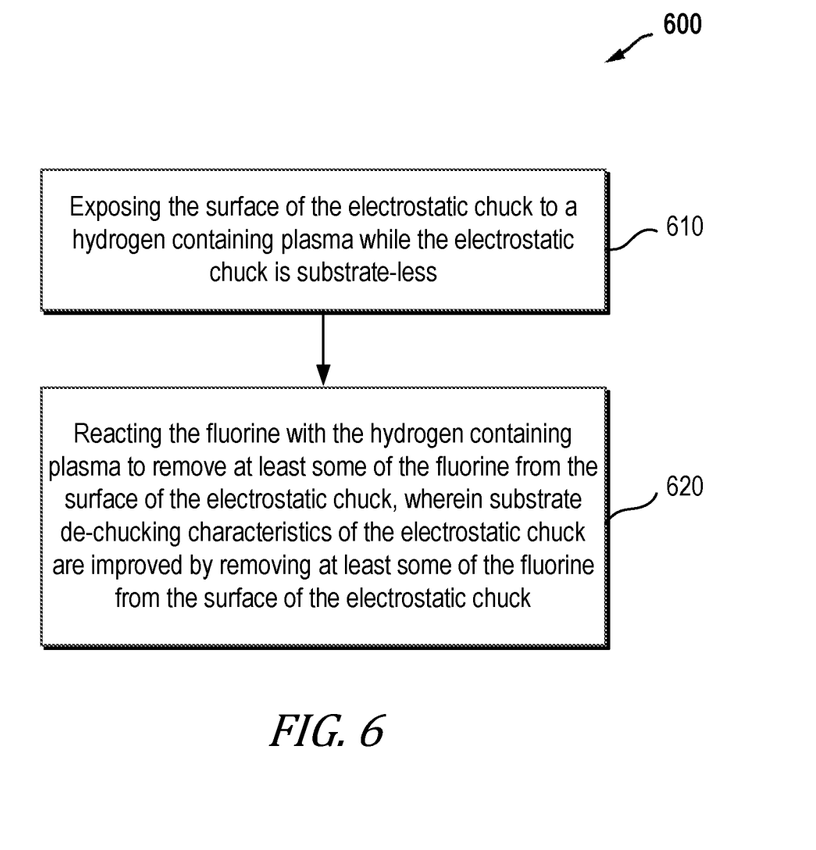
FIG. 6 illustrates another exemplary method utilizing techniques described herein.

FIGS. 5-6 illustrate exemplary methods for use of the processing techniques described herein. It will be recognized that the embodiments of FIGS. 5-6 are merely exemplary and additional methods may utilize the techniques described herein. Further, additional processing steps may be added to the methods shown in the FIGS. 5-6 as the steps described are not intended to be exclusive. Moreover, the order of the steps is not limited to the order shown in the figures as different orders may occur and/or various steps may be performed in combination or at the same time.

FIG. 5 illustrates a method 500 to reduce substrate breaks when removing a substrate from a chuck. The method 500 includes step 510, of providing the chuck with a contaminant on a surface of the chuck. The method 500 further includes step 520 of exposing the surface of the chuck to a hydrogen-containing plasma while the chuck is substrate-less. The method 500 further includes step 530 of removing at least some of the contaminant from the surface of the chuck by use of the hydrogen-containing plasma so contaminant related substrate breaks may be decreased.

FIG. 6 illustrates a method 600 of removing fluorine from a surface of an electrostatic chuck. The method 600 includes step 610 of exposing the surface of the electrostatic chuck to a hydrogen-containing plasma while the electrostatic chuck is substrate-less. The method 600 further includes step 620 of reacting the fluorine with the hydrogen-containing plasma to remove at least some of the fluorine from the surface of the electrostatic chuck, wherein substrate de-chucking characteristics of the electrostatic chuck are improved by removing at least some of the fluorine from the surface of the electrostatic chuck.

It will be recognized that the techniques disclosed herein may be utilized to limit a wide range of contaminants which cause de-chucking (and associated substrate breaks). Thus, though described with regard to chuck surfaces which are fluorinated, the techniques are not limited to just removing fluorination contaminants. Further, though described with reference to an ESC, the techniques may be applied to other chucks also. It will also be recognized that the techniques disclosed herein may be utilized during the processing of a wide range of substrates. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow. Further, a wide range of process tools which have a chuck may beneficially utilize the concepts disclosed herein.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method to reduce substrate breaks when removing a substrate from a chuck, the method comprising:

providing the chuck with a fluorine-based contaminant on a surface of the chuck;

performing a first plasma process, wherein the first plasma process exposes the surface of the chuck to a hydrogen-containing plasma while the chuck is substrate-less to remove at least some of the fluorine-based contaminant from the surface of the chuck; and performing a second plasma process after said performing the first plasma process, wherein the second plasma process exposes the surface of the chuck to an oxygen-containing plasma to remove deposits formed on the chuck during the first plasma process;

wherein removing at least some of the fluorine-based contaminant from the surface of the chuck by use of the hydrogen-containing plasma decreases contaminant related substrate breaks.

2. The method of claim 1, wherein the chuck is an electrostatic chuck.

3. The method of claim 1, further comprising repeating said performing the first plasma process and said performing the second plasma process one or more cycles.

4. The method of claim 1, wherein the hydrogen-containing plasma is a hydrocarbon-containing plasma.

5. The method of claim 4, wherein the hydrocarbon is methane.

6. The method of claim 4, wherein the second plasma process exposes the surface of the chuck to the oxygen-containing plasma to remove organic deposits formed on the chuck during its exposure to the hydrocarbon-containing plasma.

7. The method of claim 6, wherein the second plasma process is an oxygen plasma ash process.

8. The method of claim 6, wherein the chuck has an aluminum oxide surface.

9. The method of claim 8, wherein the chuck is an electrostatic chuck.

10. The method of claim 1, wherein the hydrogen-containing plasma does not comprise fluorine.

11. The method of claim 10, wherein the hydrogen-containing plasma is a hydrocarbon-containing plasma, and wherein the hydrocarbon is methane.

12. A method of removing fluorine from a surface of an electrostatic chuck, the method comprising:
exposing the surface of the electrostatic chuck to a hydrogen-containing plasma while the electrostatic chuck is substrate-less, wherein the hydrogen-containing plasma does not comprise fluorine; and
reacting the fluorine with the hydrogen-containing plasma to remove at least some of the fluorine from the surface of the electrostatic chuck; and
exposing the surface of the electrostatic chuck to a second plasma after said exposing the surface of the electrostatic chuck to the hydrogen-containing plasma, wherein the second plasma removes deposits formed on the electrostatic chuck during its exposure to the hydrogen-containing plasma;
wherein substrate de-chucking characteristics of the electrostatic chuck are improved by removing at least some of the fluorine from the surface of the electrostatic chuck.

13. The method of claim 12, wherein the hydrogen-containing plasma is a hydrocarbon-containing plasma.

14. The method of claim 13, wherein the hydrocarbon-containing plasma comprises is-methane.

15. The method of claim 13, wherein the electrostatic chuck has an aluminum oxide surface.

16. The method of claim 13, further comprising repeating said exposing the surface of the electrostatic chuck to the hydrocarbon-containing plasma and exposing the surface of the electrostatic chuck to the second plasma one or more cycles.

17. The method of claim 12, wherein the second plasma process is an oxygen plasma ash process.

18. The method of claim 17, wherein the hydrogen-containing plasma is a hydrocarbon-containing plasma, and wherein the hydrocarbon-containing plasma comprises methane.

19. The method of claim 12, further comprising performing multiple cycles of the hydrogen-containing plasma and the second plasma.

20. The method of claim 19, wherein the second plasma process is an oxygen plasma ash process.

* * * * *